(12) United States Patent
Hinrich et al.

(10) Patent No.: US 10,622,331 B2
(45) Date of Patent: Apr. 14, 2020

(54) METHOD FOR PRODUCING A SUBSTRATE ARRANGEMENT, SUBSTRATE ARRANGEMENT, AND METHOD FOR CONNECTING A SUBSTRATE ARRANGEMENT TO AN ELECTRONIC COMPONENT

(71) Applicant: Heraeus Deutschland GmbH & Co. KG, Hanau (DE)

(72) Inventors: Andreas Hinrich, Freigericht (DE); Susanne Duch, Bruchköbel (DE); Anton Miric, Alzenau (DE); Michael Schäfer, Künzell (DE); Christian Bachmann, Nordborg (DK); Holger Ulrich, Nordborg (DK); Frank Osterwald, Nordborg (DK); David Benning, Nordborg (DK); Jacek Rudzki, Nordborg (DK); Lars Paulsen, Nordborg (DK); Frank Schefuss, Nordborg (DK); Martin Becker, Nordborg (DK)

(73) Assignee: Heraeus Deutschland GmbH & Co. KG, Hanau (DE)

( * ) Notice: Subject to any disclaimer, the term of this patent is extended or adjusted under 35 U.S.C. 154(b) by 0 days.

(21) Appl. No.: 15/766,234

(22) PCT Filed: Sep. 28, 2016

(86) PCT No.: PCT/EP2016/073102
§ 371 (c)(1),
(2) Date: Apr. 5, 2018

(87) PCT Pub. No.: WO2017/060140
PCT Pub. Date: Apr. 13, 2017

(65) Prior Publication Data
US 2018/0286831 A1 Oct. 4, 2018

(30) Foreign Application Priority Data

Oct. 8, 2015 (EP) .................................... 15188966

(51) Int. Cl.
*H01L 21/48* (2006.01)
*H01L 23/00* (2006.01)
(Continued)

(52) U.S. Cl.
CPC .......... *H01L 24/83* (2013.01); *H01L 21/4821* (2013.01); *H01L 21/4867* (2013.01);
(Continued)

(58) Field of Classification Search
CPC ............... H01L 24/83; H01L 24/26–33; B22F 3/10–1146
See application file for complete search history.

(56) References Cited

U.S. PATENT DOCUMENTS

2011/0310568 A1 12/2011 Hong et al.
2013/0214033 A1 8/2013 Klein et al.

FOREIGN PATENT DOCUMENTS

CN 102263068 11/2011
CN 102315138 1/2012
(Continued)

OTHER PUBLICATIONS

The International Search Report for International Application No. PCT/EP2016/073102 dated Mar. 20, 2017 (4 pgs.).
(Continued)

*Primary Examiner* — Daniel P Shook
(74) *Attorney, Agent, or Firm* — Dicke, Billig & Czaja, PLLC

(57) ABSTRACT

One aspect relates to a method for manufacturing a substrate assembly for attachment to an electronic component
A substrate is provided with a first side and a second side.
(Continued)

Figure 1:

A contact material layer is applied to the first side of the substrate.
A pre-fixing agent is applied at least to sections of a side of the contact material layer facing away from the substrate.

11 Claims, 6 Drawing Sheets

(51) Int. Cl.
    *H01L 23/14*     (2006.01)
    *H01L 23/373*     (2006.01)
    *H01L 23/495*     (2006.01)
    *H01L 21/683*     (2006.01)
    *H05K 3/34*     (2006.01)
    *H05K 3/30*     (2006.01)

(52) U.S. Cl.
    CPC ...... *H01L 21/4871* (2013.01); *H01L 21/6836* (2013.01); *H01L 23/142* (2013.01); *H01L 23/3735* (2013.01); *H01L 23/49582* (2013.01); *H01L 24/27* (2013.01); *H01L 24/29* (2013.01); *H01L 24/95* (2013.01); *H05K 3/3436* (2013.01); *H01L 24/75* (2013.01); *H01L 24/97* (2013.01); *H01L 2221/68331* (2013.01); *H01L 2221/68363* (2013.01); *H01L 2221/68368* (2013.01); *H01L 2221/68381* (2013.01); *H01L 2224/2731* (2013.01); *H01L 2224/2732* (2013.01); *H01L 2224/2744* (2013.01); *H01L 2224/27312* (2013.01); *H01L 2224/27318* (2013.01); *H01L 2224/27334* (2013.01); *H01L 2224/27418* (2013.01); *H01L 2224/27848* (2013.01); *H01L 2224/293* (2013.01); *H01L 2224/2919* (2013.01); *H01L 2224/2939* (2013.01); *H01L 2224/29294* (2013.01); *H01L 2224/29339* (2013.01); *H01L 2224/753* (2013.01); *H01L 2224/75272* (2013.01); *H01L 2224/83002* (2013.01); *H01L 2224/8384* (2013.01); *H01L 2224/8385* (2013.01); *H01L 2224/83192* (2013.01); *H01L 2224/83439* (2013.01); *H01L 2224/83444* (2013.01); *H01L 2224/83801* (2013.01); *H01L 2224/83898* (2013.01); *H01L 2224/83907* (2013.01); *H01L 2224/83986* (2013.01); *H01L 2224/95* (2013.01); *H01L 2224/97* (2013.01); *H05K 3/305* (2013.01); *Y02P 70/613* (2015.11)

(56) References Cited

FOREIGN PATENT DOCUMENTS

| | | | |
|---|---|---|---|
| DE | 102014109766 | | 4/2015 |
| DE | 202015001441 | | 4/2015 |
| EP | 1684340 | | 7/2006 |
| EP | 2390904 | | 11/2011 |
| EP | 2390904 A2 | * | 11/2011 ............ H01L 24/83 |
| EP | 2428293 | | 3/2012 |
| EP | 2966679 | | 1/2016 |
| TW | 201320106 | | 5/2013 |
| TW | 201425397 | | 7/2014 |
| WO | 2008006340 | | 1/2008 |
| WO | 2014049059 | | 4/2014 |
| WO | 2014136683 | | 9/2014 |
| WO | WO2008006340 | * | 1/2018 |

OTHER PUBLICATIONS

The Written Opinion of the International Searching Authority for International Application No. PCT/EP2016/073102 dated Mar. 20, 2017 (12 pgs.) (English Translation).
Bai, Guofeng, "Low-Temperature Sintering of Nanoscale Silver Paste for Semiconductor Device Interconnection," XP009166994, Dissertation Submitted to the Faculty of the Virginia Polytechnic Institute and State University in Partial Fulfillment of the Requirement for the Degree of Doctor of Philosophy in Materials Science and Engineering, pp. 215 (Oct. 2005).

* cited by examiner

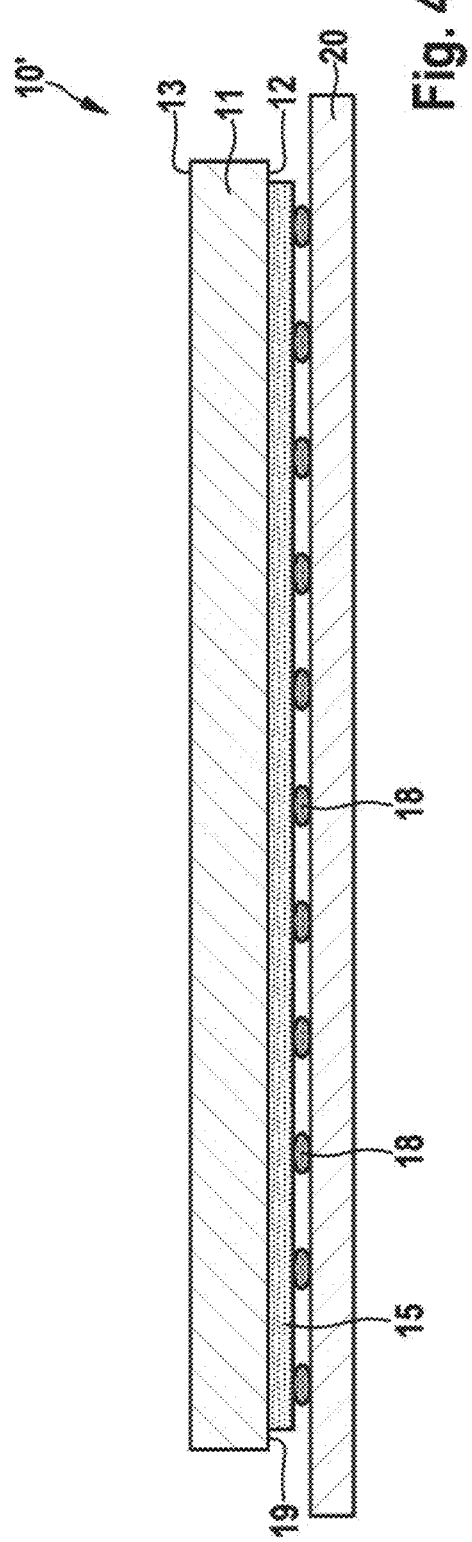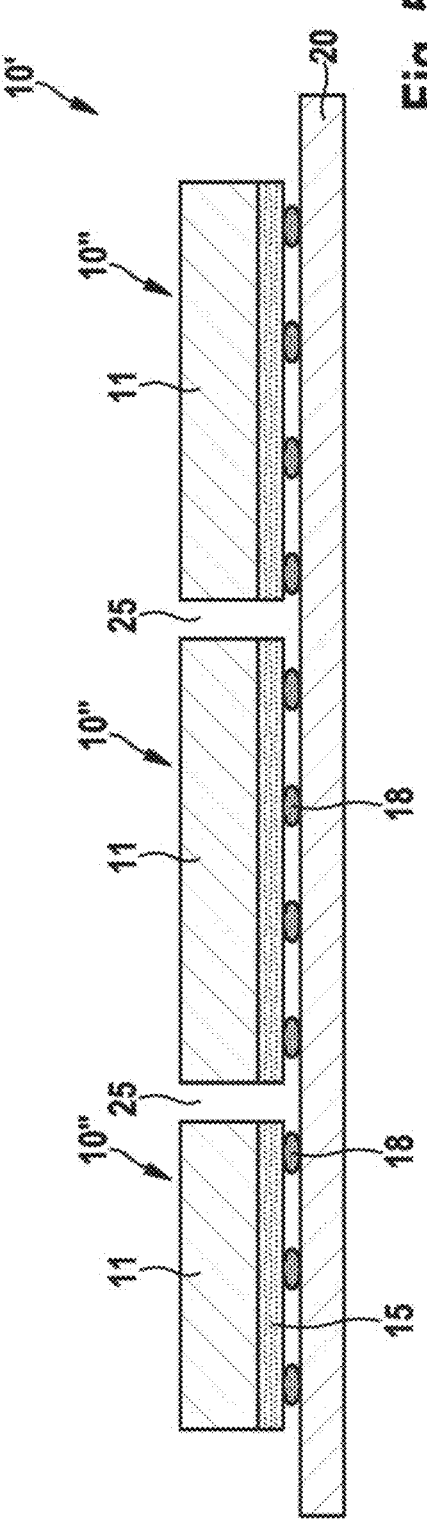

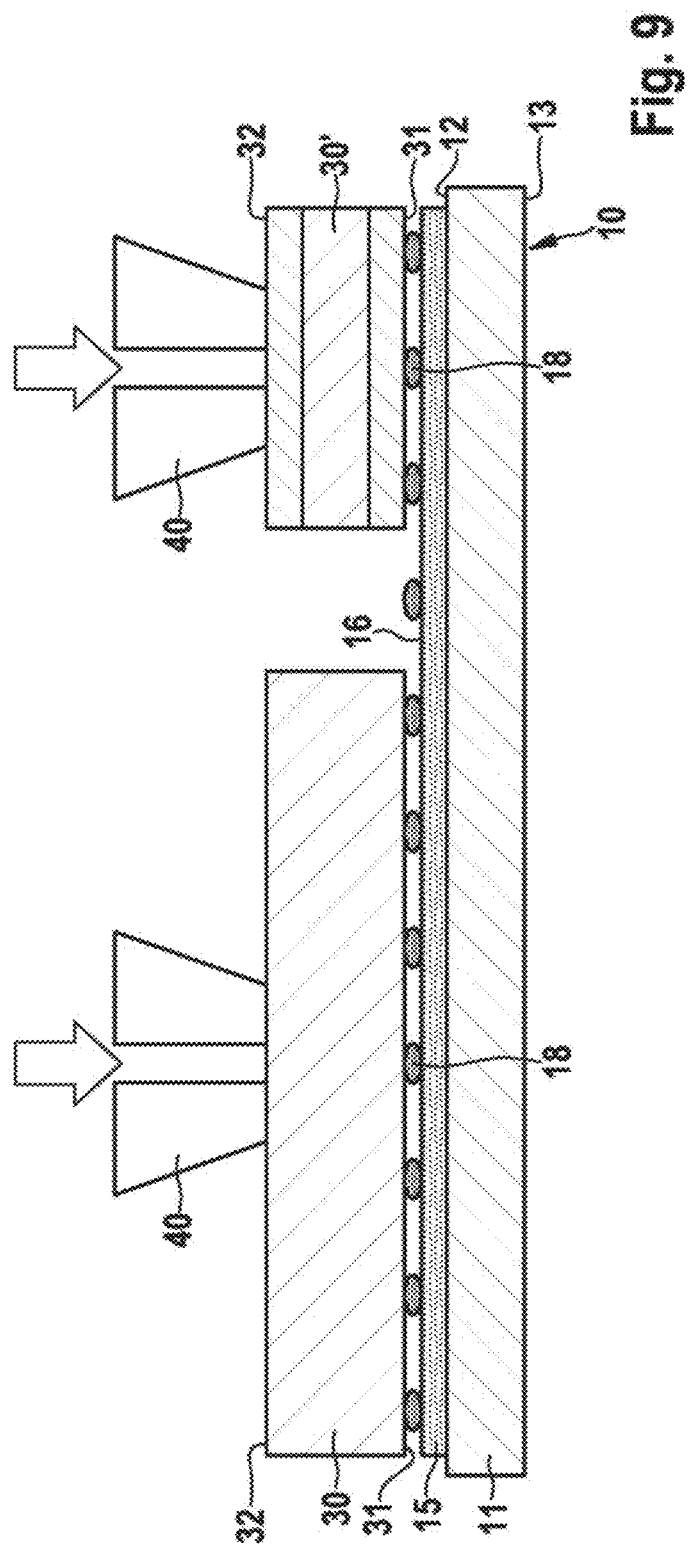

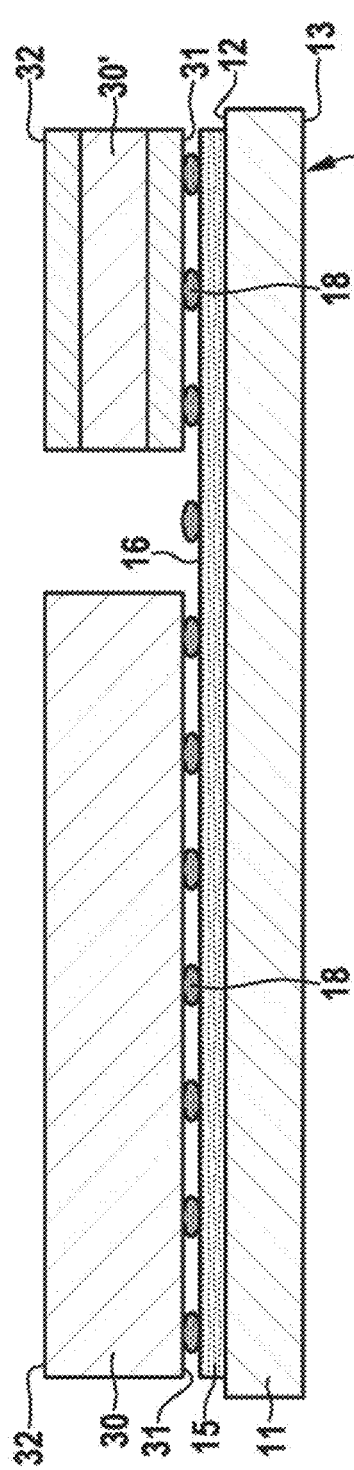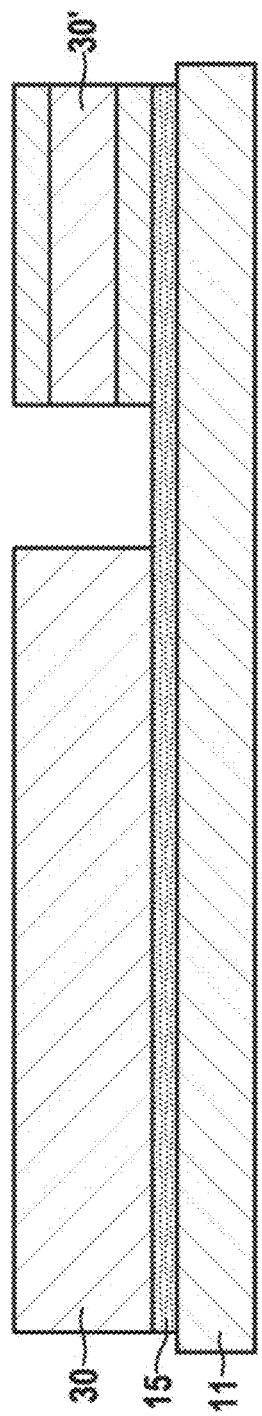

METHOD FOR PRODUCING A SUBSTRATE ARRANGEMENT, SUBSTRATE ARRANGEMENT, AND METHOD FOR CONNECTING A SUBSTRATE ARRANGEMENT TO AN ELECTRONIC COMPONENT

CROSS REFERENCE TO RELATED APPLICATION

This Utility Patent Application claims the benefit of the filing date of European Application No. EP 15188966.4, filed Oct. 8, 2015, and International Application No. PCT/EP2016/073102, filed Sep. 28, 2016, both of which are herein incorporated by reference.

The invention relates to a method for manufacturing a substrate assembly for attachment to an electronic component. The invention further relates to a substrate assembly for attachment to an electronic component. The invention also relates to a method for attaching an electronic component to a substrate assembly.

It is known in power electronics to provide substrates or components with pre-applied contacting agent such as pre-dried sintering paste, solder, conductive adhesive. During the manufacturing process at the customer's site, it is possible that components may slip during transport from the assembly location to the sintering location, particularly electronic components that are bonded to a substrate with pre-applied contacting agent, particularly with pre-dried sintering paste.

In this context, it is known that the components, particularly electronic components, are placed on the dried sintering paste while simultaneously applying heat. It has been found that for many electronic components warm assembly of this kind does not ensure adequate stability for transport, since bent components and/or dirty surfaces and/or awkward surface geometries, or very high acceleration forces during transport result in the adhesion being insufficient to withstand transport from the assembly location to the sintering location. Accordingly, it is known to secure electronic components with masks or forms, or to employ a complicated system of springs to clamp them in position after they have been assembled but before they are soldered and sintered or bonded.

A further drawback of the known prior art is that a contact material to be spread on a substrate is often applied while preserving distances from the edge of the component and/or with the formation of an uneven, ramp-like structure. Full-surface coating with a contact material using known methods is impossible or only possible to a very limited degree, because the sintering paste is subject to particular requirements when the sintering paste is sprayed, for example, and full-surface coating is often associated with significant spraying losses.

Given the state of the art as described, it is an object of the present invention to describe a method for manufacturing a substrate assembly for attachment to an electronic component, so that adequate transport stability is assured when the electronic components are transported from the assembly location to the sintering location. In addition, with a further development of the method it should be possible to coat and produce the largest possible surface area efficiently with contact material. The components should be separated from this surface area in such manner that the contact material extends as far as the edge of the compound on all sides to the degree possible.

It is a further object of the present invention to describe a substrate assembly for attachment to an electronic component, wherein the substrate assembly is embodied in such manner that a component which has been assembled but not yet soldered or sintered or bonded is sufficiently stable for transport on the substrate assembly. A further development is also provided for the purpose of ensuring that the substrate assembly has a large contact material surface area.

It is a further object of the present invention to describe a method for attaching an electronic component to a substrate assembly.

According to one embodiment, an object with regard to the method for producing a substrate assembly for attachment to an electronic component is solved with the subject matter of the independent claim.

The invention is based on the idea of describing a method for producing a substrate assembly for attachment to an electronic component which comprises the following steps:

Providing a substrate with a first side and a second side,
Applying a contact material layer to the first side of the substrate,
Applying a pre-fixing agent at least to sections of a side of the contact material layer facing away from the substrate.

The substrate assembly which is produced using the method according to the invention is used for the subsequent attachment to an electronic component.

The substrate may be a metal sheet or a section of metal band, particularly a copper sheet or a section of copper band. It is further possible that the substrate is a lead frame or a DCB substrate or a PCB substrate. The term copper sheet is also understood to pertain to a metal sheet which consists of a copper alloy material. A copper band section may be such a band section consisting of a copper alloy material.

The metal sheet or the metal band section, particularly the copper sheet or copper band section is preferably not pre-structured. It may only be necessary to have cut the substrate to be used to length and/or to have structured the lateral edges thereof.

The substrate or a substrate blank to be prepared may be coated, particularly galvanised on at least one side with a material, comprising gold (Au) or nickel-gold (NiAu) or silver (Ag) or nickel-silver (NiAg) or nickel-palladium-gold (NiPdAu). It is further possible that the material is applied to at least one side of the substrate or the substrate blank by chemical plating.

The substrate or a substrate blank to be prepared may preferably be coated, particularly with the materials described at least on the side thereof which is to be contacted later. It is also conceivable that both sides of the substrate or the substrate blank to be produced may be coated with the materials described. In one embodiment of the invention it is possible that the substrate is separated from a/the substrate blank before it is prepared, particularly before the coating process. The substrate blank may be a metal band or metal sheet, particularly a copper band or copper sheet. It is also possible that the substrate blank is a band or sheet made from a copper alloy.

It is possible that a full-surface metal band, particularly a copper band, is provided and galvanised on one side, endlessly on one side, particularly endlessly on one side. Alternatively, it is possible that the substrate is separated from the substrate blank, particularly from the metal band, particularly from the copper band, and is galvanised individually, in a galvanic rack for example.

A contact material layer is applied to the first side of the substrate, which may be for example the coated side or the side of the substrate opposite the coated side. The contact material layer should preferably be applied to the whole surface, or almost the whole surface of the first side of the substrate. At least one substrate may be positioned in a worknest for the application of the contact material layer. It is possible that multiple substrates are positioned in a worknest. It is further possible that the contact material for forming a contact material layer is applied to the first side of the substrate in a spray process. A doctor blade method is also possible.

The contact material, which is a sintering paste, particularly a silver-containing sintering paste, or a solder or a conductive adhesive or an adhesive film, is used for the actual attachment of the substrate to the electronic component. The pre-fixing agent serves solely for pre-fixing, that is for temporarily affixing the substrate to the electronic component or the electronic component to the substrate. The pre-fixing or temporary fixing affords sufficient stability to enable the component to be transported from the assembly location to the sintering location. The pre-fixing agent is a temporary fixing agent. In other words, the pre-fixing agent is a fixing agent which enables a substrate assembly or a substrate to be affixed temporarily to an electronic component.

The pre-fixing agent is applied at least to sections of a side of the contact material layer facing away from the substrate. The pre-fixing agent may be applied to the contact material layer for example by sprinkling, trickling, spraying, dispensing, jetting, or with the aid of a transfer process.

Since the pre-fixing agent is applied directly to the contact material layer, the substrate does not have to be furnished additionally with a pre-fixed means. In other words, no section of the substrate must be kept ready for the application of a pre-fixing agent or kept free of the contact material layer. This results in material savings in terms of the substrate material. The contact material layer applied to the substrate may have a layer thickness from 10-150 µm, particularly from 30-100 µm, more particularly from 40-80 µm.

The contact material layer applied to the substrate and the pre-fixing agent applied to the contact material layer are preferably dried after they have been applied.

After a contact material layer has been applied, the substrate preferably does not have a lateral edge. In this case, the entire surface of the substrate is covered with a contact material layer. It is also possible that the substrate may have a lateral edge to which no contact material layer has been applied, wherein the edge has such a width which in particular constitutes not more than 20% of the total width of the substrate, particularly not more than 10% of the total width of the substrate, more particularly not more than 5% of the total width of the substrate, most particularly not more than 1% of the total width of the substrate.

Thus, even at this stage of the method, when the substrate is being coated with a contact material or when a contact material layer is being produced on the substrate, a substrate adapter or substrate assembly is produced with smallest possible unusable edge. in other words, the first side of the substrate is furnished with as much contact material as possible, so that the largest contact material layer possible is created.

The contact material layer applied to the substrate and the pre-fixing agent applied to the contact material layer are preferably dried. In other words, the substrate with the contact material layer applied and the pre-fixing agent applied on top of the contact material layer undergoes a drying process. Drying may be carried out for 2-30 min with an object temperature of 80-150° C. If drying or pre-drying is carried out, the thickness of the applied pre-fixing agent and the thickness of the applied contact material layer may be reduced as a result of the drying and pre-drying.

In a further embodiment of the invention, the substrate with the contact material layer applied and the pre-fixing agent applied may be positioned on a carrier in such manner that the first side of the substrate is arranged to face the carrier, wherein the pre-fixing agent and possibly also the contact material layer are at least adhesively bonded with the carrier. The substrate may thus be placed on a carrier in such manner that the substrate assembly, comprising a substrate, a pre-fixing agent, a contact material layer and optionally a carrier, may be transported to another production location or another device for further processing. It is possible that only the pre-fixing agent is adhesively bonded to the carrier. A small gap may exist between the carrier and the contact material layer, for example.

The carrier serves to ensure that the substrate assembly can be transported from a first production location to another production location or from a first manufacturing device to another manufacturing device. The carrier may be for example a carrier film, particularly a carrier film with low adhesive strength. It is further possible to stretch UV tape across a wafer frame to make a carrier. The substrate furnished with a contact material layer and the pre-fixing agent may be attached adhesively to this UV tape.

According to a preferred embodiment of the invention, at least a section of one/the lateral edge of the substrate may be detached, preferably in the state in which it is attached to the carrier, and/or the substrate may be structured and/or separated, preferably in the state in which it is attached to the carrier. The final part geometry, i.e. the final geometry of the substrate adapter or the substrate assembly may consequently by created after the application of the contact material layer and of the pre-fixing agent, particularly in the state in which it is attached to the carrier. If at least sections, preferably all of one/the lateral edge of the substrate is detached from the rest of the substrate assembly or the rest of the substrate adapter, a substrate adapter is produced, in which the first side of the substrate is completely covered with a contact material layer, or whole of the surface of the first side is furnished with a contact material layer. The unusable edge of the substrate assembly or substrate adapter is removed.

It is further possible that a plurality of substrate assemblies may be produced from an initially larger substrate assembly by separation. Structuring of the substrate is possible, for example for adapting the substrate and the substrate assembly to the geometry of the component that is to be attached.

The detachment of the lateral edge and/or structuring of the substrate and/or separation of the substrate is preferable performed with a laser. Extremely small components can be worked with a laser cutting process. Moreover, very sharp edges can be created with the aid of a laser cutting process.

Particularly when the substrate is in the attached state with the carrier, at least sections of the contact material layer and/or of the pre-fixing agent may be detached and/or structured and/or separated as well during detachment of the lateral edge and/or during structuring of the substrate and/or during separation of the substrate. If the contact material layer is detached and/or structured and/or separated, the ramps which are formed for example by pressing of the contact material layer may be eliminated. Additionally, the laser machining process of the contact material layer enables the most even contact material layers possible to be created or produced.

The subsequent laser cutting or laser machining of the substrate assembly provides unlimited shaping capability, so that the method according to the invention enables the production of a wide variety of structures and component combinations. For example, a contact material layer with base area of 180 mm×180 mm or 190 mm×190 mm may be applied to a substrate with dimensions of 200 mm×200 mm. After detachment of the lateral edge, therefore, the production of a substrate adapter with dimensions up to 190 mm×190 mm is possible, wherein the whole surface of such a substrate is completely covered with a contact material layer.

The contact material of the contact material layer preferably comprises an auxiliary sintering agent and metal particles, particularly silver particles. The auxiliary sintering agent is understood to consist of organic compounds. The contact material may further comprise binding agents and/or fatty acids. The binding agents are particularly polymers such as cellulose derivatives, for example methyl cellulose, ethyl cellulose, ethylmethyl cellulose, carboxycellulose and hydroxypropyl cellulose.

The fatty acids may particularly be acrylic acid (octanoic acid), capric acid (decanoic acid), lauric acid (dodecanoic acid), myristic acid (tetradecanoic acid), palmitic acid (hexadecanoic acid), margaric acid (heptadecanoic acid), stearic acid (octadecanoic acid), arachidic acid (eicosanoic acid/icosanoic acid), behenic acid (docosanoic acid), lignoceric acid (tetracosanoic acid).

Accordingly, the term auxiliary sintering agent comprises the fatty acids and/or binding agents and/or organic compounds present in the contact material. The contact material in the contact material layer is preferably a sintering paste, particularly a silver sintering paste. The pre-fixing agent preferably comprises the same auxiliary sintering agent. Metal particles, particularly silver particles, are preferably not contained in the pre-fixing agent.

Since the contact material and the pre-fixing agent preferably comprise the same auxiliary sintering agent, the contact material layer is not contaminated in the form of another pre-fixing agent, such as an adhesive, during pre-fixing or when the pre-fixing agent is applied to the contact material layer. Undesirable contaminations associated with the contact material layer are thus avoided.

The invention is further based on the idea of describing a substrate assembly for attaching to an electronic component, wherein the substrate assembly is preferably produced with an aforementioned method according to the invention. The substrate assembly according to the invention comprises a substrate, which is particularly a metal sheet or a metal band section, preferably a copper sheet or a copper band section, or a lead frame or DCB substrate or a PCB substrate, with a first side and a second side, wherein a contact material layer is applied to at least sections of the first side of the substrate, wherein a pre-fixing agent is applied at least to sections of a side of the contact material layer facing away from the substrate.

In a preferred embodiment of the invention, the contact material layer is applied to the whole surface or almost the whole surface on the first side of the substrate.

The contact material of the contact material layer comprises auxiliary sintering agents and metal particles, particularly silver particles. In a preferred embodiment of the invention, the pre-fixing agent comprises the same auxiliary sintering agent. The auxiliary sintering agent is understood to consists of the fatty acids and/or binding agents and/or organic compounds that are in the contact material.

The binding agents are particularly polymers such as cellulose derivatives, for example methyl cellulose, ethyl cellulose, ethylmethyl cellulose, carboxy cellulose and hydroxypropyl cellulose.

The fatty acids may particularly be acrylic acid (octanoic acid), capric acid (decanoic acid), lauric acid (dodecanoic acid), myristic acid (tetradecanoic acid), palmitic acid (hexadecanoic acid), margaric acid (heptadecanoic acid), stearic acid (octadecanoic acid), arachidic acid (eicosanoic acid/icosanoic acid), behenic acid (docosanoic acid), lignoceric acid (tetracosanoic acid).

At least one side of the substrate is coated, particularly galvanised with material comprising gold (Au) or nickel-gold (NiAu) or silver (Ag) or nickel-silver (NiAg) or nickel-palladium-gold (NiPdAu). It is also possible that the described material is deposited on at least one side of the substrate by chemical plating.

In a further embodiment, the substrate assembly includes a carrier which is particularly embodied as a carrier film, wherein the carrier is at least adhesively bonded with the pre-fixing agent. It is possible that the at least sections of the contact material are also adhesively bonded to the carrier. The substrate is arranged in such manner relative to the carrier that the first side of the substrate is arranged to face the carrier. The carrier serves to enable the substrate assembly to be transported from a first production location to another production location or from a first manufacturing device to another manufacturing device. The carrier may be for example a carrier film with low adhesive strength. It is also possible that the carrier is a UV tape.

In a particularly preferred embodiment of the invention, the whole surface of the first side of the substrate is covered with the contact material layer. In a further embodiment of the invention it is possible that the substrate may have a lateral edge to which no contact material layer has been applied, wherein the edge has such a width which in particular constitutes not more than 20% of the total width of the substrate, particularly not more than 10% of the total width of the substrate, more particularly not more than 5% of the total width of the substrate, most particularly not more than 1% der total width of the substrate.

Regarding the structure of the substrate assembly, particularly regarding the advantage of the substrate assembly according to the invention, particular mention is made of the preceding notes and explanations in conjunction with the method according to the invention.

The invention is further based on the idea of describing a method for attaching an electronic component to a substrate assembly. The substrate assembly may particularly be a substrate assembly according to the invention and/or substrate assembly that was produced using the described method according to the invention. The method according to the invention for attaching an electronic component to a substrate assembly comprises the steps of:

Positioning the substrate assembly and the at least one electronic component relative to each other in such manner that a/the first side of a/the substrate is arranged to face the electronic component, Pre-fixing the substrate assembly with the at least one electronic component with a/the pre-fixing agent applied to at least sections of a side of a contact material layer, Attaching the substrate assembly to the at least one electronic component.

Positioning of the substrate assembly and the electronic component relative to each other in such manner that a/the first side of the substrate is arranged to face the electronic component may be carried out in such manner that the substrate assembly is placed on the electronic component.

In a further embodiment, it is conceivable that the electronic component is placed on the substrate assembly.

If the substrate assembly comprises a carrier or is arranged on a carrier, the substrate is detached from a/the carrier together with the applied contact material layer and the applied pre-fixing agent particularly before the substrate assembly and the electronic component are positioned with respect to each other.

After the substrate assembly and the electronic component have been positioned with respect to each other, the substrate assembly is preferably pre-fixed with the electronic component. This pre-fixing is carried out with the aid of the pre-fixing agent which is applied to at least sections of the first side of the substrate. For this purpose, it is preferably exposed to heat. A temperature preferably from 100-150° C. is applied, so that the pre-fixing agent is activated by means of the applied heat and the substrate assembly is thus able to be pre-fixed with the electronic component. With such pre-fixing, it is possible to achieve a condition in which the substrate assembly pre-fixed with the attached electronic component is stable enough for transport, so that the electronic component can no longer be shaken loose by the thrust of a conveyor belt. Instead, the electronic component remains in its pre-fixed position.

The substrate together with the applied contact material layer and the applied pre-fixing agent may be detached from a/the carrier with the aid of a nozzle. The substrate may be attached to an electronic component together with the applied contact material layer and the applied pre-fixing agent as part of a pick-and-place process. This may be carried out in a single step, i.e., the substrate may be placed on the electronic component immediately after the carrier has been detached. It is also possible that the detachment of the substrate from the carrier and the placement of the substrate together with the contact material layer and the pre-fixing agent on the electronic component are carried out in two separate steps.

The electronic component may be a semiconductor or a DCB substrate or a PCB substrate. The attachment of the substrate assembly to the electronic component takes place temporally after the pre-fixing. The attachment of the substrate assembly to the electronic component may be carried out example by sintering and/or pressing and/or soldering and/or adhesive bonding. In other words, the substrate assembly is sintered and/or pressed and/or soldered and/or bonded to the electronic component, the substrate assembly is preferably sintered to the electronic component. For this purpose the substrate assembly is furnished with the contact material layer, particularly in the form of silver-sintering paste.

Regarding the pre-fixing agent in conjunction with the method according to the invention for attaching an electronic component to a substrate assembly, reference is made to the previous explanations in respect of the pre-fixing agent. Reference is also made to the previous explanations regarding the arrangement of the pre-fixing agent and the contact material layer relative to each other.

The substrate assembly fixed to the electronic component is preferably transported in a process furnace for attaching the substrate assembly to the electronic component. The process furnace may be for example a pressure sintering furnace or a sintering press or a reflow furnace or a laminating furnace.

In the following text, the invention and further features thereof will be explained in greater detail with reference to the accompanying schematic drawings based on exemplary embodiments. In the drawings:

FIGS. 1-5: show individual steps of the method for producing a substrate assembly;

FIGS. 6a-8: show individual steps of a method according to the invention for attaching an electronic component to a substrate assembly according to a first embodiment; and FIGS. 9-11: show individual steps of a method according to the invention for attaching an electronic component to a substrate assembly according to another embodiment.

In the following text, the same reference numbers will be used for identical and functionally equivalent parts.

In FIG. 1, a substrate 11 is represented. Substrate 11 has a first side 12 and a second side 13. Substrate 11 is preferably a copper band section. It is also possible for copper alloys band sections to be used.

It may be provided further that substrate 11 is coated on one or both sides 12 and 13 thereof. The first side 12 and/or the second side 13 is/are preferably coated, particularly galvanised with gold or nickel-gold or silver or nickel-silver or nickel-palladium-gold.

In the example shown, the first side 12 of substrate 11 is designed parallel to the opposite, second side 13 of substrate 11.

Figure 2:
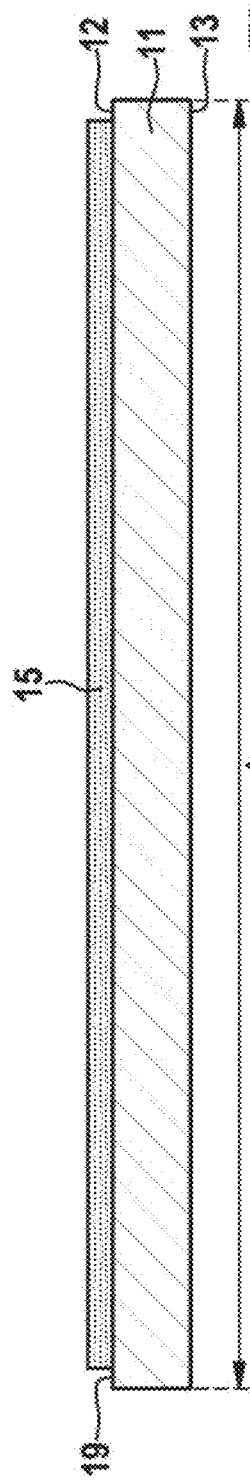

FIG. 2 shows that a contact material is applied to side 12 of substrate 10 to form a contact material layer 15. The contact material of contact material layer 15 is preferably a sintering paste, particularly a silver sintering paste. A sintering paste typically consists of auxiliary sintering agents and metal particles. In particular, the metal particles are silver particles. The auxiliary sintering agents are organic compounds and/or fatty acids and/or binding agents.

Contact material layer 15 may be applied to the first side 12 of the substrate 11 with the aid of a pressing process. A contact material layer 15 is preferably applied to the largest possible area of the first side 12 of substrate 11. However, narrow edges 19 may remain on substrate 11 or on the first side 12 of substrate 11 which are not covered with the contact material layer 15 due to the selected application technique, for example in the pressing process.

Figure 3:
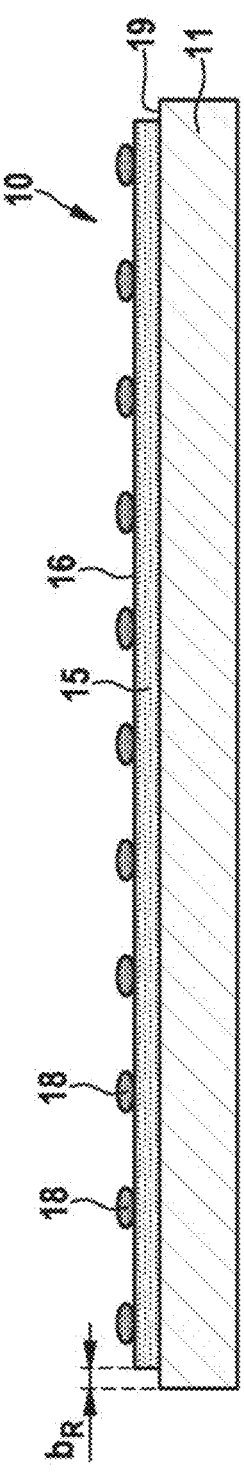

Edge 19 preferably has such a width $b_R$, which particularly constitutes not more than 5% of the total width $b_S$ of the substrate 11. As is shown in FIG. 3 a pre-fixing agent 18 is applied to the first side 16 of contact material layer 15. The first side 16 of contact material layer 15 is the side of the contact material layer 15 facing away from substrate 11 or the first side 12 of substrate 11.

Pre-fixing agent 18 is applied to this first side 16 of the contact material layer in the form of droplet-shaped elements or elliptical elements. The pre-fixing agent 18 comprises the same auxiliary sintering agent as the contact material of contact material layer 15. The effect of this is that when the substrate assembly 10 is brought into contact with an electronic component no contaminations or materials of other kinds are introduced into contact material layer 15.

According to FIG. 3, substrate assembly 10 comprises substrate 11, contact material layer 15 and pre-fixing agent 18. The contact material layer 15 applied to the substrate 11 has a layer thickness from 40-80 µm.

As is shown in FIG. 4, substrate 11 with the contact material layer 15 applied and the pre-fixing agent 18 applied is positioned on a carrier 20 in such manner that the first side 12 of substrate 11 is arranged to face carrier 20, wherein the pre-fixing agent 18 is at least adhesively bonded with carrier 20. Carrier 20 may be a carrier film. In the example shown, a UV tape is stretched over a wafer frame, so that substrate 11 is applied to this UV tape together with the contact material layer 15 and pre-fixing agent 18. In the representation according to FIG. 4, substrate assembly 10' thus comprises the carrier 20, the substrate 11 as well as the contact material layer 15 and pre-fixing agent 18.

FIG. 5 shows that substrate assembly 10' has been brought into a desired final part geometry. With the aid of a laser, for example, the edges 19 are removed. Substrate 11 in the state in which it is attached to carrier 20 is also detached. Cutouts 25 are introduced into substrate 10', so that the substrate assembly 10' is divided into three individual geometries or three smaller substrate assemblies 10". When the lateral edge 19 was detached and when substrate 11 was separated, at least sections of the contact material layer 15 and the pre-fixing agent 18 were also detached or structured and separated.

Figure 6B:
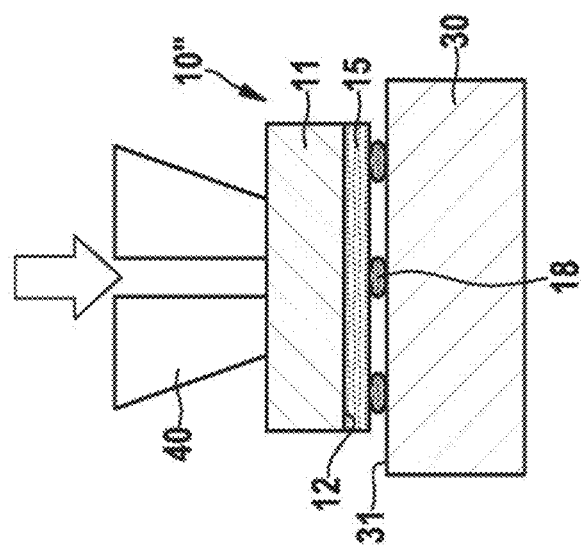
Figure 6A:
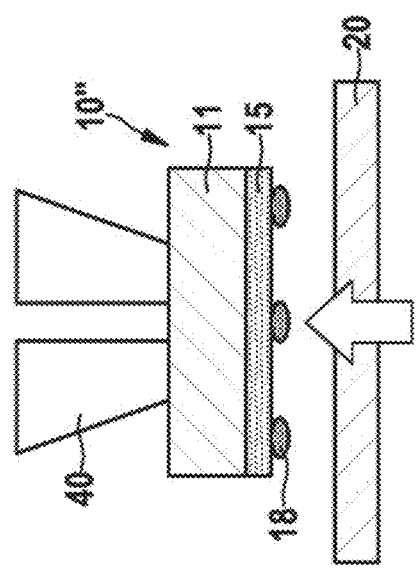

As represented in FIG. 6a, a separated substrate assembly 10" is detached from carrier 20 with the aid of a nozzle 40. The separated substrate assembly 10" may be for example the left substrate assembly 10" of FIG. 5. The adhesive bond between the fixing agent 18 and the carrier 20 is removed by the application of a tensile force to substrate assembly 10", so that substrate assembly 10" may be attached to electronic component 30 again with the aid of nozzle 40. Substrate assembly 10" and electronic component 30 are positioned relative to each other in such manner that the first side 12 of substrate 11 is arranged to face electronic component 30.

Figure 7:
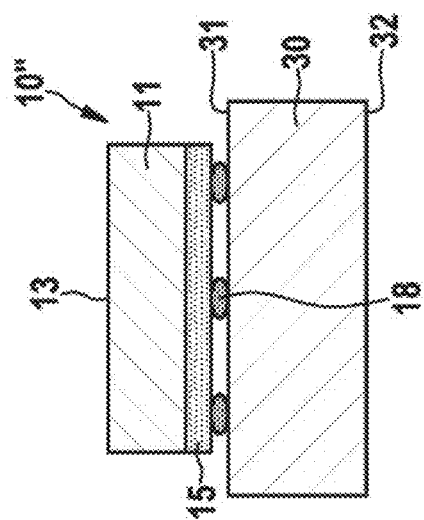

According to FIG. 7, substrate assembly 10" is pre-fixed to the at least one electronic component 30 by the pre-fixing agent 18 applied to at least sections of the first side 16 of contact material layer 15. Substrate assembly 10" is accordingly pre-fixed on the first side 31 of electronic component 30 with the aid of the pre-fixing agent 18. Pre-fixing may be carried out by the application of light pressure and/or the application of heat. On other hand, in the embodiment shown the second side 32 of electronic component 30 is free of further layers and/or components.

Figure 8:
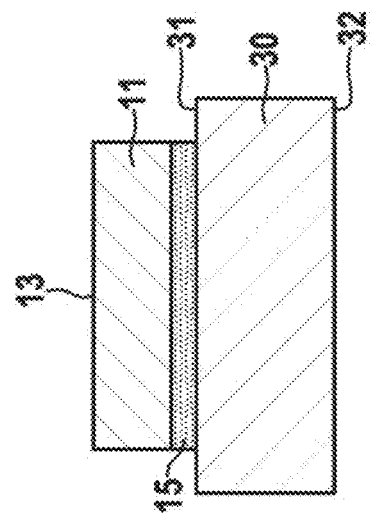

In FIG. 8, the electronic component 30 is represented in the state in which it is attached to the substrate assembly. The pre-fixing agent 18 is dissolved when the substrate assembly 10" is attached to the electronic component 30, particularly when sintering and/or pressing and/or bonding. All that remains is the contact material layer 15. Since the pre-fixing agent 18 comprises the same auxiliary sintering agent as the contact material in contact material layer 15, the contact material layer is not contaminated. In other words, after processing the pre-fixing agent or the pre-applied adhesive is inactive and no longer present.

A second embodiment relating to a method for attaching at least one electronic component to a substrate assembly 10 is represented in FIGS. 9-11. The method steps shown are typically preceded by the method steps represented in FIGS. 1-3, wherein substrate 13 may also be a lead frame, a DCB or a PCB. Accordingly, it is possible to position two electronic components 30 and 30' on a substrate assembly 10, which in the example shown does not comprise a carrier. Electronic components 30 and 30' are positioned in a mounting process. In this context, a "pick-and-place" process is conceivable.

In the example represented in FIG. 9, heat may also be applied. Electronic components 30 and 30' are each positioned so that the first sides 31 of the electronic components 30 and 30' are facing towards the first side 12 of the substrate 11, so that electronic components 30 and 30' can be pre-fixed on substrate assembly 10 by the pre-fixing agent 18 on the first side 16 of contact material layer 15. As is represented in FIG. 10, electronic components 30 and 30' are secured for further processing by the pre-fixing agent 18 or pre-applied adhesive.

The pre-fixing is followed by the actual attachment of substrate assembly 10 to the electronic components 30 and 30'. The term attachment is understood to mean the joining of the substrate assembly 10 to electronic components 30 and 30'. The attachment may be carried out by soldering or pressing or sintering or adhesive bonding. In this context it is conceivable that the substrate assembly 10 is sintered together with electronic components 30 and 30' in a process furnace, e.g., a pressure sintering furnace or a sintering press or a reflow furnace or a laminating furnace. Pre-fixing agent 18 is removed almost entirely, particularly burned off and/or melted off during the attachment, preferably sintering. After processing, the pre-applied adhesive is inactive and no longer present.

It should be noted at this point that of the method steps and elements described in the preceding text in connection with the embodiments according to FIGS. 1-11, particularly the details represented in the drawings may be claimed as essential to the invention either alone or in any combination.

The invention claimed is:

1. A method for manufacturing a substrate assembly for attachment to an electronic component, the method comprising:
   providing a substrate with a first side and a second side;
   applying a contact material layer to the first side of the substrate such that the substrate has a lateral edge on which no contact material is applied;
   applying a pre-fixing agent at least to sections of a side of the contact material layer facing away from the substrate;
   positioning the substrate with applied contact material layer and applied pre-fixing agent on a carrier film such that the first side of the substrate is arranged to face the carrier, and wherein the pre-fixing agent is at least adhesively bonded with the carrier;
   separating the substrate, while applied to the carrier film, into multiple substrate assemblies, including separating from the substrate the lateral edges on which no contact material is applied.

2. The method of claim 1, wherein the substrate is one of a group comprising a metal sheet, a metal band section, a copper sheet, a copper band section, a lead frame, a DCB substrate, and a PCB substrate.

3. The method of claim 1, wherein the substrate or a substrate blank is coated on at least one side with a material comprising one of gold (Au), nickel-gold (NiAu), silver (Ag), nickel-silver (NiAg), nickel-palladium-gold (NiPdAu), by galvanising or chemical plating.

4. The method of claim 1, wherein the contact material layer applied to the substrate has a layer thickness in a range comprising one of from 10-150 µm, from 30-100 µm, and from 40-80 µm.

5. The method of claim 1, wherein after a contact material layer is applied, the substrate has a lateral edge on which no contact material layer has been applied, and wherein the edge has such a width ($b_R$) that is not more than 20% of the total width ($b_S$) of the substrate.

6. The method of claim 1, wherein at least sections of a lateral edge of the substrate, in the state in which it is attached to the carrier, are detached and/or the substrate is structured and/or separated, in the state in which it is attached to the carrier.

7. The method of claim 6, wherein the detachment of the lateral edge and/or the structuring of the substrate and/or the separation of the substrate is/are carried out by means of laser.

8. The method of claim 6, wherein at least sections of the contact material layer and/or the pre-fixing agent is/are detached and/or structured and/or separated when the lateral edge is detached and/or when the substrate is structured and/or when the substrate is separated.

9. The method of claim 1, wherein contact material of the contact material layer comprises auxiliary sintering agent and silver particles, and wherein the pre-fixing agent comprises the same auxiliary sintering agent.

10. The method of claim 1, contact material comprising a sintering paste including metal particles and auxiliary sintering agents, the pre-fixing agent being a sintering agent of the sintering paste.

11. The method of claim 10, the auxiliary sintering agents being at least one of organic compounds, fatty acids, and binding agents.

* * * * *